United States Patent

Liu et al.

[11] Patent Number: 5,953,614
[45] Date of Patent: Sep. 14, 1999

[54] PROCESS FOR FORMING SELF-ALIGNED METAL SILICIDE CONTACTS FOR MOS STRUCTURE USING SINGLE SILICIDE-FORMING STEP

[75] Inventors: Yauh-Ching Liu, Sunnyvale; Gary K. Giust, Cupertino; Ruggero Castagnetti, San Jose; Subramanian Ramesh, Cupertino, all of Calif.

[73] Assignee: LSI Logic Corporation, Milpitas, Calif.

[21] Appl. No.: 08/947,742

[22] Filed: Oct. 9, 1997

[51] Int. Cl.⁶ .................................................. H01L 21/336
[52] U.S. Cl. ......................... 438/303; 438/655; 438/664
[58] Field of Search .................................... 438/303, 305, 438/306, 307, 655, 656, 657, 664

[56] References Cited

U.S. PATENT DOCUMENTS

| | | | |
|---|---|---|---|
| 5,322,809 | 6/1994 | Moslehi | 438/655 |
| 5,447,875 | 9/1995 | Moslehi | 438/305 |
| 5,607,884 | 3/1997 | Byun | 438/303 |
| 5,639,678 | 6/1997 | Lee et al. | 438/655 |
| 5,661,085 | 8/1997 | Teong | 438/655 |
| 5,723,377 | 3/1998 | Torii | 438/303 |

*Primary Examiner*—Chandra Chaudhari
*Attorney, Agent, or Firm*—John P. Taylor

[57] ABSTRACT

A process is described for forming self-aligned contacts to an MOS device on an integrated circuit structure characterized by the simultaneous formation of the metal silicide gate portion and the metal silicide source/drain portions. The process comprises forming a gate oxide layer on a silicon substrate, forming a polysilicon gate electrode layer over the gate oxide layer, and forming a layer of a first insulation material over the polysilicon gate electrode layer. Metal silicide is simultaneously formed on the exposed surface of the polysilicon gate electrode and over the exposed portions of the silicon substrate. Source/drain regions are formed in the silicon substrate, either before or after formation of the metal silicide over the exposed portions of the silicon substrate, whereby the metal silicide portions on the substrate above the source/drain regions are in electrical communication with the source/drain regions.

23 Claims, 6 Drawing Sheets

PROCESS FOR FORMING SELF-ALIGNED METAL SILICIDE CONTACTS FOR MOS STRUCTURE USING SINGLE SILICIDE-FORMING STEP

BACKGROUND OF THE INVENTION

1. Field of the Invention

This invention relates to integrated circuit structures. More particularly, this invention relates to an improvement in the formation of self-aligned metal silicide contacts for MOS devices in integrated circuit structures, wherein a single step is used to form metal silicide over both the gate electrode and the source/drain regions.

2. Description of the Related Art

In the formation of MOS devices on integrated circuit structures, metal silicide portions are conventionally formed over the polysilicon gate electrode and over the source/drain regions of the silicon substrate to reduce the contact resistance, as well as to provide low interconnect and gate delay. This is illustrated in prior art FIG. 1, wherein a silicon substrate 2 is shown with source/drain regions 4, 6, and 8 formed therein and metal silicide portions 10, 12, and 14 formed respectively thereover. Between source/drain regions 4 and 6 (and metal silicide portions 10 and 12 thereon) is a polysilicon gate electrode 16 formed over a gate oxide 18 on substrate 2. Sidewall insulation spacers 20 and 22 (e.g., oxide spacers) are formed on the sidewalls of gate electrode 16 to respectively insulate gate electrode 16 from source/drain region 4 and metal silicide portion 10 thereon, and source/drain region 6 and metal silicon portion 12 thereon. A polysilicon gate electrode 24 for a second MOS transistor is similarly formed between source/drain regions 6 and 8 over a gate oxide 26 on substrate 2. Sidewall insulation spacers 28 and 30 are formed on the sidewalls of gate electrode 24 to respectively insulate gate electrode 24 from source/drain region 6 and metal silicide portion 12 thereon, and source/drain region 8 and metal silicon portion 14 thereon. Metal silicide portions 32 and 34 are shown respectively formed over the top surfaces of polysilicon gate electrodes 16 and 24.

Figure 1:
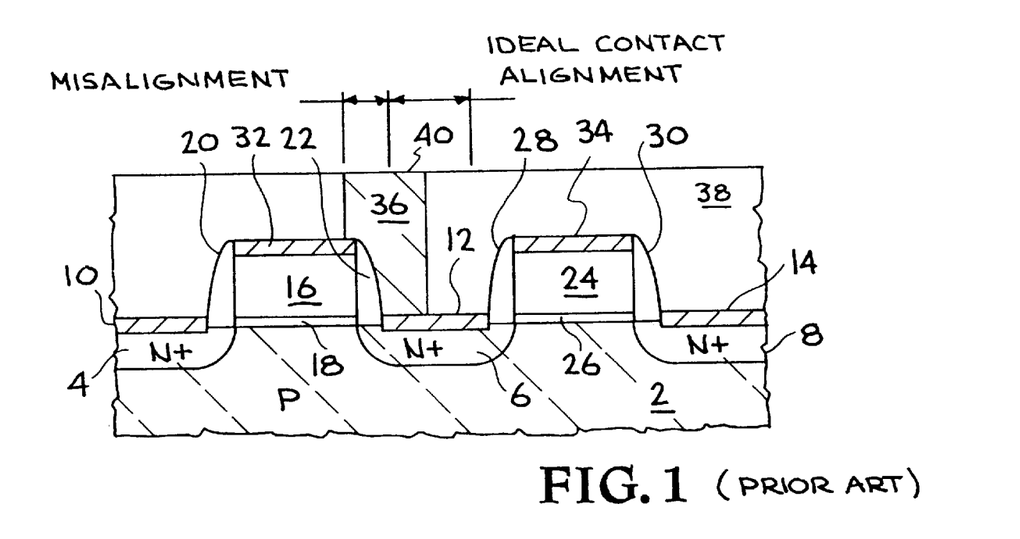
FIG. 1 is a fragmentary vertical cross-sectional view of a prior art MOS structure without self-aligned contact openings.

In the structure shown in FIG. 1, metal silicide portions 10, 12, 14, 32, and 34 may be formed at the same time by a blanket deposition of a silicide-forming metal over source/drain regions 4, 6, and 8, sidewall spacers 20, 22, 28, and 30, as well as over polysilicon gate electrodes 16 and 24. Annealing such a structure results in a reaction between the silicide-forming metal and silicon surfaces in contact with the metal to form the desired metal silicide portions respectively over source/drain regions 4, 6, and 8, and over polysilicon gate electrodes 16 and 24. The silicide-forming metal over the insulation spacers does not react and this metal may then be selectively removed, using an etch system selective to the metal silicide and the sidewall insulation spacers.

While the foregoing prior art structure provides a simple way of forming self-aligned metal silicide (salicide) over the source/drain regions and gate electrode in a single silicide-forming step, it is sometimes difficult to subsequently form a properly aligned contact opening to the metal silicide over a source/drain region between two closely spaced apart gate electrodes, as shown in FIG. 1. This problem is exacerbated as contact areas shrink with ever smaller and smaller devices and closer spacing of devices on the semiconductor substrate. As illustrated in FIG. 1, a misaligned contact opening 36 is inadvertently formed in a dielectric layer 38 over the MOS structure, so that both metal silicide 12 over source/drain region 6 and metal silicide 32 over gate electrode 16 are exposed. Subsequent filling of misaligned contact opening 36 with metal 40 will result in an electrical short between source/drain region 6 and gate electrode 16.

To remedy this problem in the prior art, a self-aligned contact opening construction was developed wherein the metal silicide over the gate electrode was formed in a separate process step and then covered with an insulation material prior to formation of the source/drain metal silicide. Subsequent formation of a misaligned contact opening to the source/drain region did not result in exposure to the metal silicide over the gate electrode as long as the dielectric material over the metal silicide on the gate electrode was different from the material used in forming the overlying dielectric layer in which the source/drain contact opening was formed.

Figure 2A:
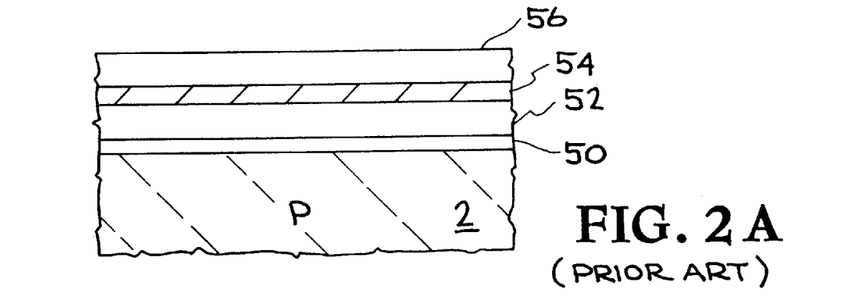
FIGS. 2A–2F are step by step fragmentary vertical cross-sectional views of the construction of a prior art MOS structure with self-aligned contact openings.
Figure 2B:
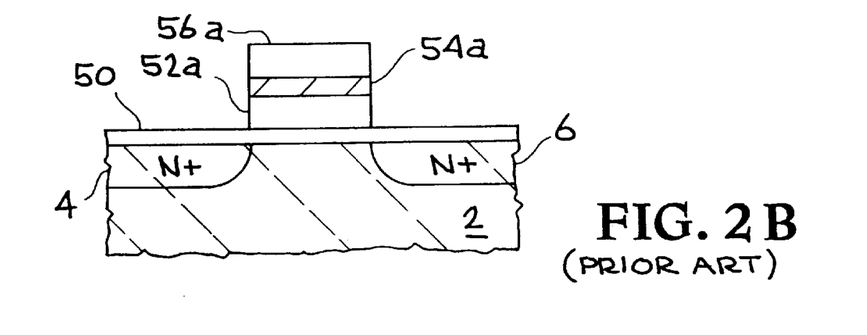
Figure 2C:
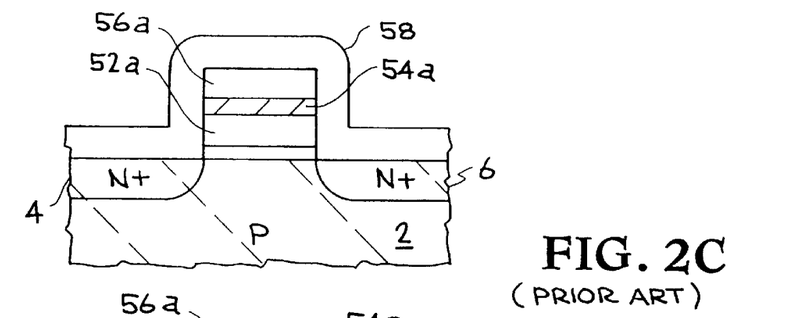
Figure 2D:
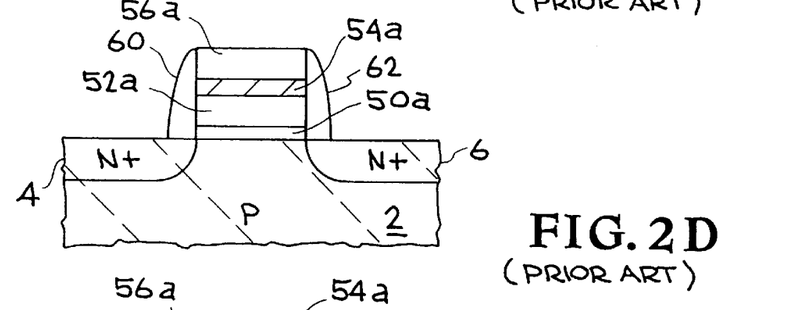
Figure 2E:
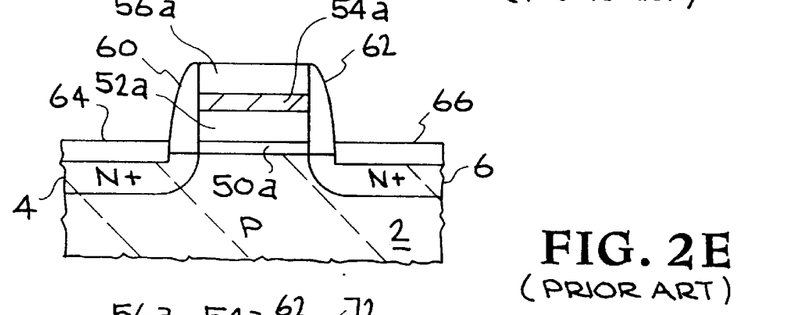
Figure 2F:
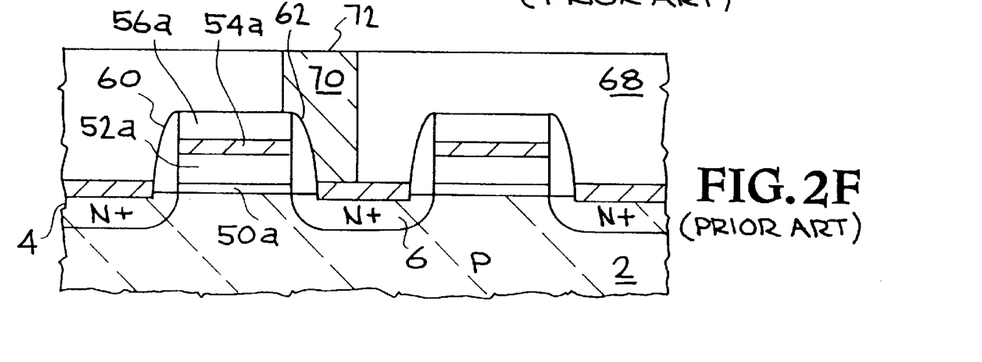

Formation of such a structure is shown in FIGS. 2A–2F. In FIG. 2A, a gate oxide layer 50 is first formed over silicon substrate 2 followed by blanket deposition of polysilicon layer 52. A metal silicide layer 54 is then formed over polysilicon layer 52 and a first insulation layer 56, e.g., silicon nitride, is formed over metal silicide layer 54. The polysilicon, metal silicide, and first insulation layers are then patterned to form a polysilicon gate electrode 52a having a metal silicide portion 54a thereon with gate insulation 56a formed over metal silicide portion 54a, as shown in FIG. 2B. Source/drain regions 4 and 6 may then be formed in substrate 2 followed by deposition of a conformal layer of a second insulation layer 58, which may comprise the same material as first insulation layer 56, as shown in FIG. 2C. Sidewall insulation spacers 60 and 62 are then formed from second insulation layer 58 by anisotropic etching of layer 58, as shown in FIG. 2D, which also results in removal of the unexposed portions of gate oxide layer 50, leaving gate oxide 50a beneath polysilicon gate electrode 52a. Self-aligned metal silicide source/drain portions 64 and 66 are then respectively formed over source/drain regions 4 and 6, as shown in FIG. 2E. A third insulation layer 68 is then formed over the structure comprising a different material from first and second insulation layers 56 and 58 materials from which gate insulation 56a and insulation spacers 60 and 62 were formed. When a misaligned contact opening 70 is then formed to metal silicide 66 over source/drain region 6 through third insulation layer 68, as shown in FIG. 2F, gate insulation material 56a over metal silicide gate portion 54a prevents gate metal silicide gate portion 54a from exposure. Subsequently filling of misaligned source/drain contact opening 70 with metal 72 to form a contact to metal silicide source/drain portion 64 does not result in undesirable electrical contact to metal silicide gate portion 54a and the MOS device is not shorted out.

While the construction just described, and illustrated in FIGS. 2A–2F, does remedy the problem of electrical shorting between the gate and one of the source/drain regions resulting from misaligned contact openings, it results in a need to provide two steps for the respective formation of metal silicide over the gate electrodes, and metal silicide over the source/drain regions, resulting in the need for further annealing steps (sometimes two annealing steps are required for each metal silicide formation, depending upon the metal used for the silicide formation), which has a negative impact on the overall thermal budget (total amount of heat exposure) for the construction of the integrated circuit structure.

It would, therefore, be desirable to provide a process wherein the gate electrode of an MOS device would be protected from inadvertent shorting to an adjacent source/drain region without, however, requiring multiple steps for the respective formations of metal silicide over the gate electrode and metal silicide over the source/drain regions.

SUMMARY OF THE INVENTION

In accordance with the invention a process for forming self-aligned contacts to an MOS device on an integrated circuit structure characterized by the simultaneous formation of metal silicide over the gate electrode and the metal silicide over the source/drain regions comprises: forming a gate oxide layer on a silicon substrate, forming a polysilicon gate electrode layer over the gate oxide layer, and forming a layer of a first insulation material over the polysilicon gate electrode layer. The layer of first insulation material and the polysilicon gate electrode layer are then patterned to form a polysilicon gate electrode having its upper surface covered with the first insulation material. Thin sidewall spacers of a second insulation material different from the first insulation material are then formed on the sidewalls of the polysilicon gate electrode and the sidewalls of the first insulation material over the polysilicon gate electrode by depositing a thin layer of the second insulation material over the structure, and then anisotropically etching the layer of second insulation material, and exposed portions of the gate oxide layer, to also expose portions of the silicon substrate where source/drain regions are formed. The first insulation material over the polysilicon gate electrode is then selectively removed to expose the upper surface of the polysilicon gate electrode. Metal silicide is then simultaneously formed on the exposed surface of the polysilicon gate electrode and over the exposed portions of the silicon substrate where the source/drain regions are formed. Source/drain regions are formed in the silicon substrate either before or after formation of the metal silicide over the exposed portions of the silicon substrate, whereby the respective metal silicide portions on the substrate above the source/drain regions are in electrical communication with the source/drain regions thereunder. A layer of a third insulation material is then formed over the structure of sufficient thickness to fill the opening over the gate electrode between the thin sidewall spacers. This layer of a third insulation material is then anisotropically etched to form thick sidewall spacers on the thin sidewall spacers, and an insulation cap of third insulation material over the metal silicide formed on the gate electrode. A layer of a fourth insulation material different from the third insulation material is then formed over the structure and a source/drain contact opening is formed through the layer of fourth insulation material to the metal silicide over the source/drain region, whereby the third insulation material over the metal silicide on the upper surface of the gate electrode will protect the metal silicide on the gate electrode during the formation of the source/drain contact opening through the fourth insulation material.

DETAILED DESCRIPTION OF THE INVENTION

The invention comprises a process for forming self-aligned contacts to an MOS device on an integrated circuit structure characterized by the simultaneous formation of the metal silicide gate portion and the metal silicide source/drain portions in the same process step.

Figure 3:
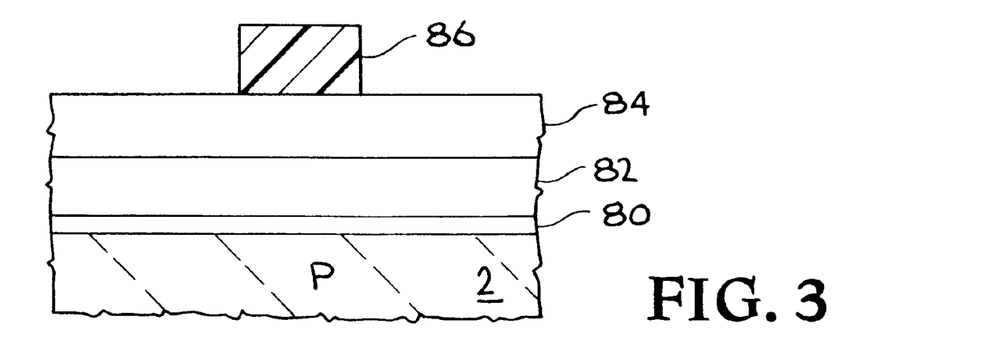
FIG. 3 is a fragmentary vertical cross-sectional view of a silicon substrate having a gate oxide layer, a polysilicon gate electrode layer, and a layer of first insulation material formed thereon, in accordance with the process of the invention.

Referring now to FIG. 3, a silicon substrate 2 is shown having formed thereon a thin oxide layer 80 comprising a silicon oxide material capable of forming the gate oxide beneath the gate electrode of an MOS device, and herein after referred to as gate oxide layer 80. Gate oxide layer 80 will range in thickness form about 20 Angstroms to about 100 Angstroms. It should be noted that a P doped silicon substrate is illustrated with an NMOS device subsequently shown as being formed therein for illustrative purposes only, it being understood that the invention may be equally utilized in the formation of PMOS devices in N doped substrates, or in the construction of either PMOS or NMOS devices respectively formed in wells of opposite conductivity doping to the device being formed. Not shown are conventional field oxide portions previously formed in the substrate surface to provide insulation/isolation boundaries for the MOS devices to be formed in the substrate.

Over gate oxide layer 80 is formed a doped polysilicon layer 82 capable of forming the polysilicon gate electrode for an MOS device, and hereinafter referred to as polysilicon gate electrode layer 82. Polysilicon gate electrode layer 82 will range in thickness from about 1000 Angstroms to about 4000 Angstroms. Over polysilicon gate electrode layer 82 is formed a layer 84 of first insulation material which may be the same or different from gate oxide layer 80. That is, the first insulation material may comprise undoped silicon oxide (the same as gate oxide layer 80) or may comprise a different insulation material such as silicon nitride, or may comprise a doped silicon oxide, such as a borosilicon glass (BSG), a phosphorus silicon glass (PSG), or a borophosphorus silicon glass (BPSG), which each respond to etch systems at a different rate than undoped silicon oxide or than one another. The thickness of layer 84 of first insulation material will range from about 500 Angstroms to about 2000 Angstroms.

The use of the term "different" herein, with respect to the various insulation materials to be described herein, will be understood to mean that a particular insulation material etches at a different rate or selectivity compared to another insulation material so that one of several insulation materials may be selectively etched in the presence of one or more other insulation materials which either do not etch in the particular etch system, or else etch at a sufficiently lower rate to permit the desired retention of the one or more other insulation materials during the etching of the one insulation material.

Over layer 84 of first insulation material is formed a mask to permit patterning of layer 84 and underlying polysilicon layer 82, such as resist mask 86 as shown in FIG. 3. Layer 84 is first etched with an appropriate wet or dry etch system to form gate electrode insulation cap 88 shown in FIG. 4, followed by an etch system which will etch underlying polysilicon layer 82 to form polysilicon gate electrode 90 also shown in FIG. 4. The etch system used to etch polysilicon layer 82 should be one which shows high selectivity to silicon oxide so that the polysilicon etch will stop on gate oxide layer 80. Preferably both the etch system used to etch layer 84, and the etch system used to etch polysilicon layer 82 will be anisotropic dry etches to avoid any lateral etching (undercutting) of either gate insulation cap 88 or polysilicon gate electrode 90. An example of a dry etch which can be used to etch insulation layer 84, when layer 84 comprises an undoped oxide layer, is an etch which utilizes fluorocarbon chemistry such as $CF_4$, or $CHF_3$, or combinations thereof, while an example of a dry etch which can be used to etch layer 84, when layer 84 comprises a nitride layer, is an etch which uses $SF_6$ and HBr chemistry. When layer 84 of first insulation material comprises a doped silicon oxide, such as PSG, BSG, or BPSG silicon oxide, $CF_4$, or $CHF_3$, may be used as a selective etch system. KOH may be used as a selective wet etch which will preferentially etch polysilicon layer 82, while a $Cl_2$ or HBr chemistry can be used for the dry etching of polysilicon.

Figure 4:
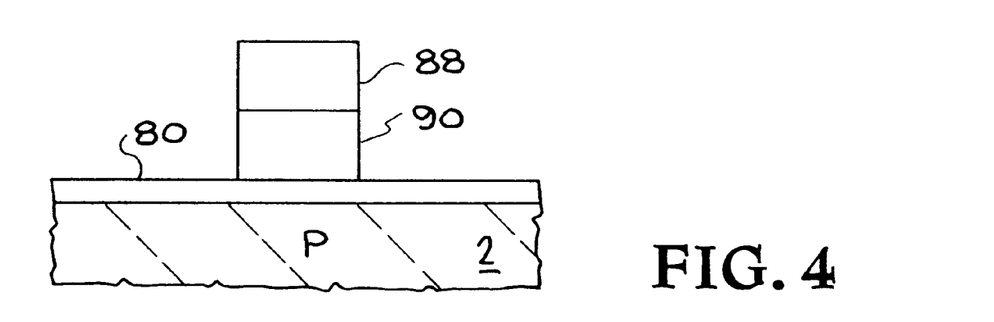
FIG. 4 is a fragmentary vertical cross-sectional view of the structure of FIG. 3 after patterning of the polysilicon gate electrode and the overlying first insulation layer to form a polysilicon gate electrode having its upper surface covered with first insulation material.

After formation of gate electrode 90 and gate insulation cap 88 thereon, the substrate may be optionally implanted to form N- or P- lightly doped drain (LDD regions in the substrate, using dopant levels and implantation energies well known to those skilled in the art.

Figure 5:
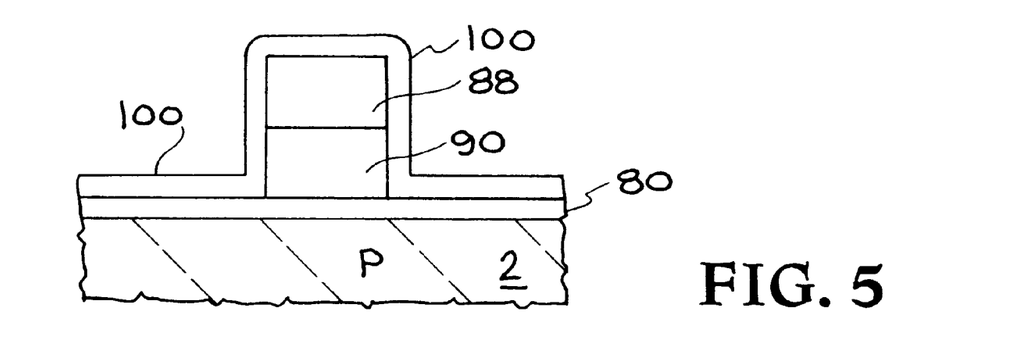
FIG. 5 is a fragmentary vertical cross-sectional view of the structure of FIG. 4 after formation of a thin layer of second insulation material formed over the structure.

Now referring to FIG. 5, a thin layer 100 of a second insulation material is blanket deposited over the structure. Thin layer 100 should range in thickness from about 100 Angstroms to about 1000 Angstroms, preferably from about 200 Angstroms to about 400 Angstroms, and most preferably from about 250 Angstroms to about 350 Angstroms, with a typical thickness being about 300 Angstroms. Thin layer 100 must comprise a second insulation material which will etch selectively to the first insulation material which comprises gate electrode insulation cap 88. The second insulation material may comprise any undoped insulation material such as the undoped silicon oxide and silicon nitride previously described, provided that it does not comprise the same insulation material as first insulation layer 84, i.e., it must be possible to selectively etch one insulation layer with respect to each other.

In a preferred embodiment, when the first insulation material of layer 84 comprises silicon nitride, the second insulation material of layer 100 will comprise an undoped silicon oxide similar or identical to gate oxide layer 80. However, it will be understood that in addition to comprising insulation material different from one another, both insulation layer 84 and insulation layer 100 may each be formed of materials different from gate oxide layer 80, in which case the second insulation material comprising thin layer 100 and gate oxide layer 80 will be respectively etched in separate steps.

After formation of thin layer 100, layer 100 is subject to an anisotropic etch to form thin insulation spacers 104 and 106 on the sidewalls of polysilicon gate electrode 90 and on the sidewalls of gate electrode insulation cap 88. It should be emphasized again that it is very important that the etch system used to etch the second insulation material comprising insulation layer 100 be highly selective to the first insulation material comprising gate electrode insulation cap 88 because the presence of insulation cap 88 is very important to the achievement of the desired height of thin insulation spacers 104 and 106, as will become apparent later.

With respect to the thickness or width of thin spacers 104 and 106, this spacer thickness will be controlled principally by the original thickness of layer 100, but also to some extent by the duration of the anisotropic etch of layer 100. The reason why thin spacers are desired at this point is to minimize any spacing between the source/drain regions (or LDD regions, when such are used) to be formed in the substrate and the channel region of the substrate below the gate oxide and gate electrode. A final spacer thickness for thin spacers 104 and 106 ranging from about 100 Angstroms to about 1000 Angstroms will be satisfactory. The final height of thin spacers 104 and 106, above the substrate surface, is also important because, as will be illustrated below, it is desired that a metal silicide gate portion be formed over polysilicon electrode 90 and a protective insulation cap formed over the metal silicide gate portion. This height will be determined principally by the sum of the initial thickness of layer 84 of first insulation material from which gate electrode insulation cap 88 is formed, and the initial thickness of polysilicon layer 82 from which gate electrode 90 is formed. Preferably, the final height of thin spacers 104 and 106 above the surface of substrate 2 will range from about 1000 Angstroms to about 4000 Angstroms.

Figure 6:
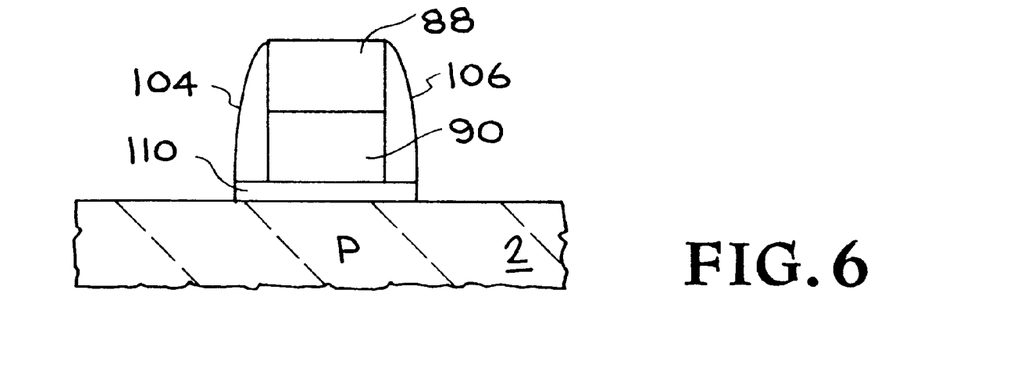
FIG. 6 is a fragmentary vertical cross-sectional view of the structure of FIG. 5 after anisotropic etching of the layer of second insulation material to form thin sidewall spacers on the sidewalls of the polysilicon gate electrode and on the sidewalls of the first insulation material on the gate electrode, and to remove exposed portions of the gate oxide layer.

When the second insulation material comprising layer 100 comprises the same material as gate oxide layer 80, the anisotropic etch used to form thin insulation spacers 104 and 106 from layer 100 may also be used to remove the exposed portions of gate oxide layer 80, resulting in the structure shown in FIG. 6. Alternatively, if the second insulation material of layer 100 comprises a different material from gate oxide layer 80, i.e., a material which does not etch in the same etch system at the same rate, a separate etch step can be carried out, after the anisotropic etching of layer 100, to remove the exposed portions of gate oxide layer 80, leaving (in either case) gate oxide 110 beneath polysilicon gate electrode 90.

Figure 7:
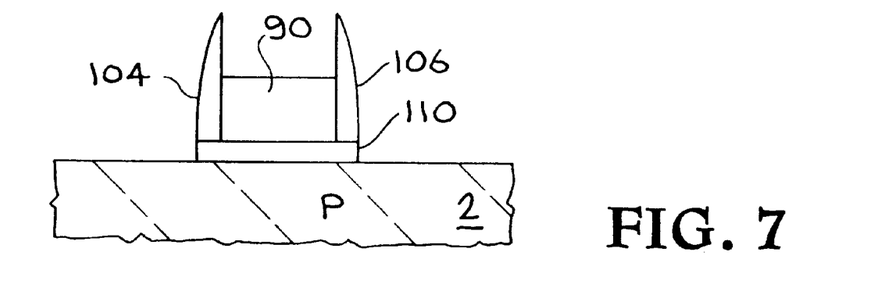
FIG. 7 is a fragmentary vertical cross-sectional view of the structure of FIG. 6 after selective removal of the first insulation material over the polysilicon gate electrode.

After formation of thin insulation spacers 104 and 106 and removal of the exposed portions of gate oxide layer 80, gate electrode insulation cap 88 may be removed, using the same etch system previously used to pattern first insulation layer 84, resulting in the structure shown in FIG. 7. However, it should be noted that whatever etch system is used, it must not act to undercut gate oxide 110 beneath polysilicon gate electrode 90. Thus, an anisotropic dry etch would be preferred.

Figure 8:
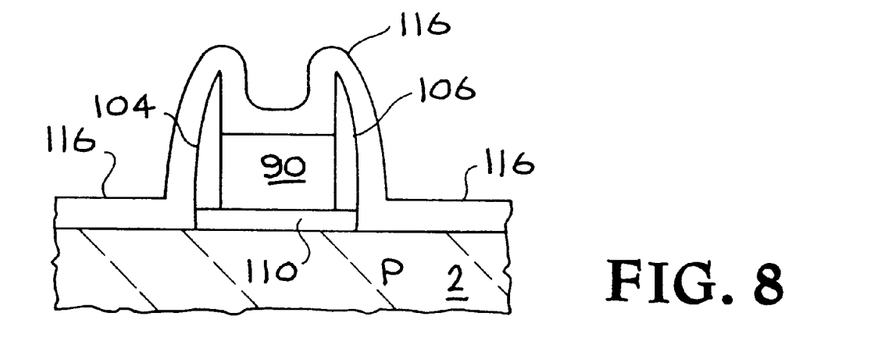
FIG. 8 is a fragmentary vertical cross-sectional view of the structure of FIG. 7 after deposition of a silicide-forming metal layer over the structure.

Following removal of gate electrode insulation cap 88, a layer 116 of a metal capable of forming a silicide is blanket deposited over the structure, as shown in FIG. 8. Examples of such metals include titanium, cobalt, tantalum, molybdenum, nickel, and platinum. Metal layer 116 may range in thickness form about 100 Angstroms to about 750 Angstroms, depending upon the desired thickness of the metal silicide portion to be formed from the metal.

Figure 9:
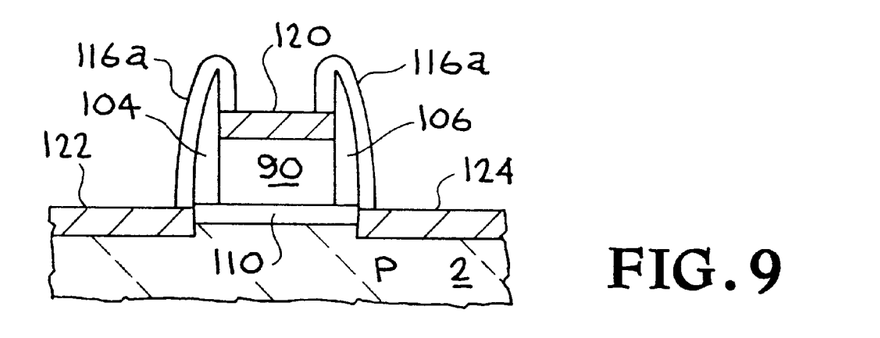
FIG. 9 is a fragmentary vertical cross-sectional view of the structure of FIG. 8 after an annealing step to form metal silicide on the top surface of the polysilicon gate electrode and over exposed portions of the silicon substrate where source/drain regions will be formed, and also showing unreacted metal on the sidewall spacers.

Following the deposition of metal layer 116, the structure is annealed at a temperature sufficiently high to cause the silicide-forming metal in metal layer 116 to react with the polysilicon gate electrode 90 and with exposed portions of silicon substrate 2 to form the metal silicide gate portion 120 over polysilicon gate electrode 90 and metal silicide source/drain portions 122 and 124, as shown in FIG. 9. The exact temperature range will vary with the particular metal comprising metal layer 116, but in any event, the temperature must not be high enough for any reaction to occur between the silicide-forming metal and those portions of thin insulation spacers 104 and 106 in contact with metal layer 116. For example, when metal layer 116 comprises titanium, the structure may be heated to a temperature ranging from at least about 400° C., preferably about 500° C. up to about 700° C., but preferably not exceeding about 675° C. (to avoid any reaction between the titanium and any silicon in either silicon nitride or silicon oxide used in formation of thin spacers 104 and 106). The annealing step may be carried out in a heated furnace over a period of, for example, about 30–90 minutes, or it may be carried out over a period of seconds under rapid thermal annealing (RTA) conditions. It should be noted that this single metal silicide-forming step of the invention occurs at a later stage in the formation of the MOS device than would normally occur in the conventional prior art process used to form a self-aligned contact opening, as illustrated in FIG. 2A.

Figure 10:
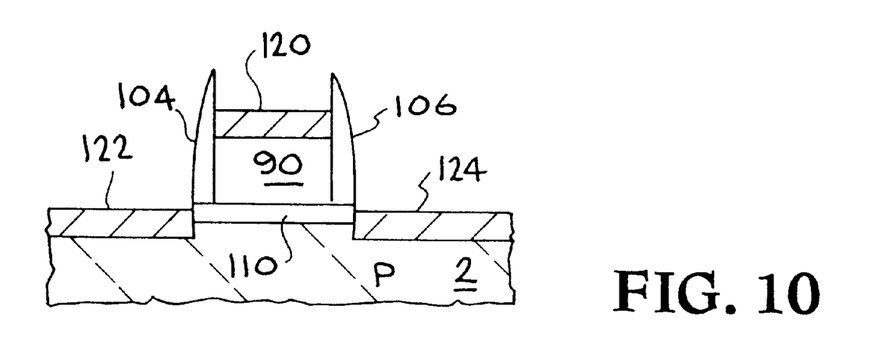
FIG. 10 is a fragmentary vertical cross-sectional view of the structure of FIG. 9 after selective removal of the unreacted silicide-forming metal.

After formation of the desired metal silicide over gate electrode 90 and over those portions of silicon substrate 2 where the source/drain regions will be formed, unreacted metal 116a is removed from the structure, including the surfaces of thin insulating spacers 104 and 106, leaving, as shown in FIG. 10, gate metal silicide portion 120 over polysilicon gate electrode 90 and metal silicide portions 122 and 124 over silicon substrate 2 (which will become metal silicide source/drain portions after formation of the source/drain regions). Unreacted metal 116a may be selectively removed, for example, when titanium comprises the silicide-forming metal, by use of a mixture of $NH_4OH$ and $H_2O_2$.

Figure 12:
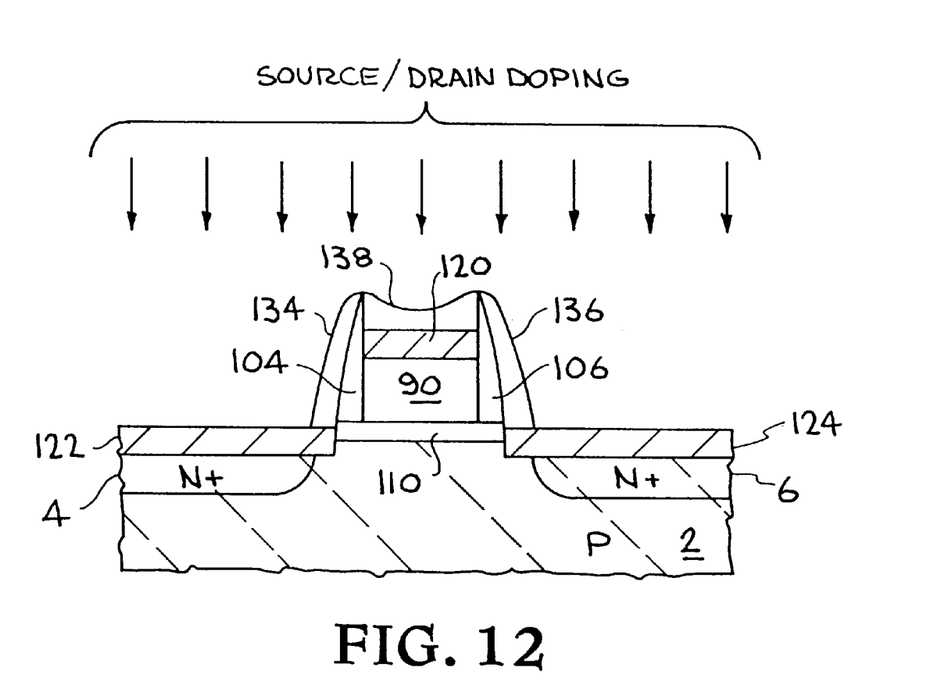
FIG. 12 is a fragmentary vertical cross-sectional view of the structure of FIG. 11 after anisotropic etching of the third layer to form thicker sidewall spacers of the third insulation material over the thin sidewall spacers on the sidewalls of the polysilicon gate electrode and over the metal silicide on the gate electrode, and further showing the implantation of the substrate to form the source/drain regions therein.

An insulating layer 130 comprising a third insulation material is then deposited to form a conformal layer over the entire structure, as shown in FIG. 12, using an insulating material which may comprise the same or a different insulation material from the insulation material used to form insulating layer 100. That is, the second and third insulation materials may comprise the same or different materials. The purpose of insulation layer 130 is to form a protective insulation cap over gate electrode 90 and metal silicide gate portion 120, and to form thicker sidewall spacers over thin sidewall spacers 104 and 106. Thus, insulation layer 130 may comprise any undoped insulation material as already discussed, but preferably will comprise either undoped silicon oxide or silicon nitride.

Figure 11:
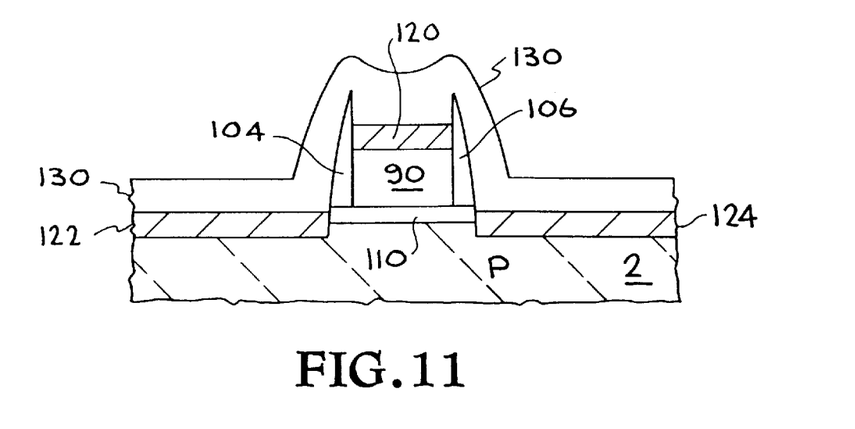
FIG. 11 is a fragmentary vertical cross-sectional view of the structure of FIG. 10 after deposition of a layer of third insulation material over the structure.
Figure 11A:
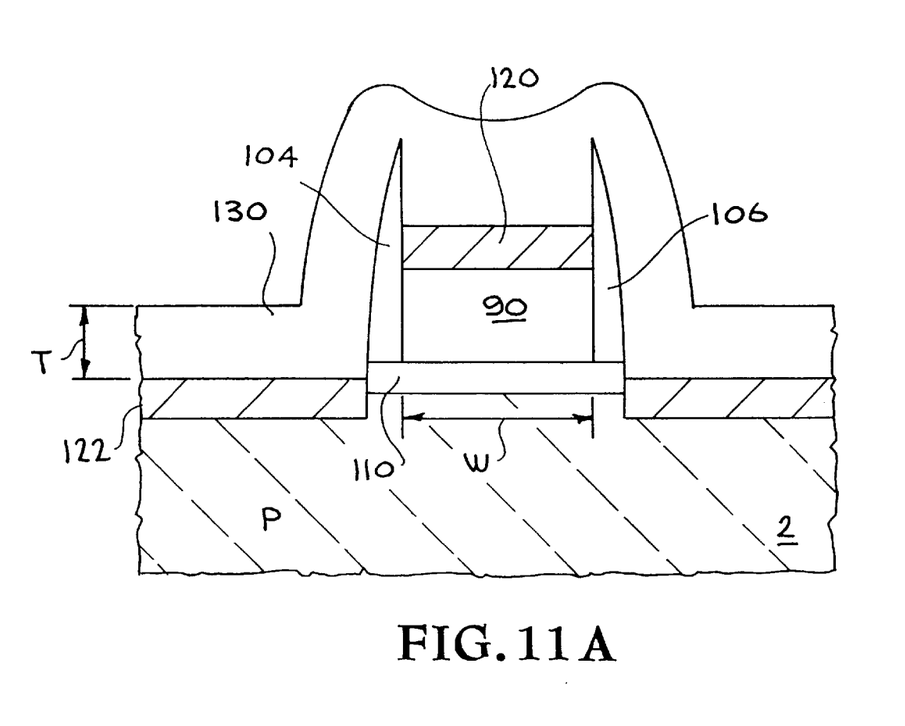
FIG. 11A is an enlarged fragmentary vertical cross-sectional view of a portion of the structure of FIG. 11 showing the thickness t of the third insulation layer and the width w of the polysilicon gate electrode.

The thickness of insulation layer 130 must be sufficient to bridge and fill the gap over polysilicon gate electrode 90 and metal silicide 120 thereon between spacers 104 and 106. To assure such bridging of the gap and adequate filling of this space, even after the anisotropic etching of layer 130 as will be described below, the thickness of insulation layer 130, over source/drain regions 4 and 6, should be greater that ½ of the width of polysilicon gate electrode 90. That is, t>w/2 where t equals the thickness of layer 130 over source/drain regions 4 and 6, and w equals the width of polysilicon gate electrode 90, as shown in FIG. 11A. Within these constraints, the thickness of third insulating layer 130, above source/drain regions 4 and 6, may range from about 350 Angstroms to about 4000 Angstroms.

After deposition of insulation layer 130, a further anisotropic etch is conducted to form thick insulation spacers 134 and 136 respectively on the outer sidewalls of thin insulation spacers 104 and 106, and to form a gate insulation cap 138 over metal silicide gate portion 120, as shown in FIG. 12. Any of the previously discussed anisotropic etchant systems may be used, depending upon the selection of third insulation material for layer 130. From an examination of FIG. 12, it will be apparent why it is very important that the etch system used for the earlier removal of gate electrode insulation cap 88 be selective to the second insulation material used to form thin insulation spacers 104 and 106. The upward protrusion or height of the tops of thin insulation spacers 104 and 106 results in the deposition of a thicker amount of conformal insulation layer 130 at and over the top of thin insulation spacers 104 and 106 and gate electrode 90 and gate electrode metal silicide portion 120 therebetween. As a result, the anisotropic etch to form thick spacers 134 and 136 removes all of third insulation layer 130 over metal silicide source/drain portions 122 and 124, but leaves a gate insulation cap 138 over metal silicide gate portion 120.

After formation of thick sidewall spacers 134 and 136, substrate 2 may be conventionally implanted to form source/drain regions 4 and 6 in substrate 2 respectively below metal silicide source/drain portions 122 and 124, as also shown in FIG. 12. Such a source/drain implant may comprise a conventional P type doping using, for example, boron as the dopant for formation of P+ source/drain regions for PMOS devices or, as shown in FIG. 12, may comprise a conventional N type doping using, for example, phosphorus or arsenic as the dopant to form N+ source/drain regions for NMOS devices. Dopant concentrations and implant energies used for such conventional formation of the source/drain regions are well known to those skilled in the art. It should be noted that while the formation of source/drain regions 4 and 6 is herein described as occurring at this stage of construction, after formation of metal silicide portions 122 and 124, and after formation of sidewall spacers 134 and 136, it will be understood that substrate 2 may be implanted earlier in the process, if desired, for example, after formation of the structure shown in FIG. 7, to form source/drain regions 4 and 6.

Figure 13:
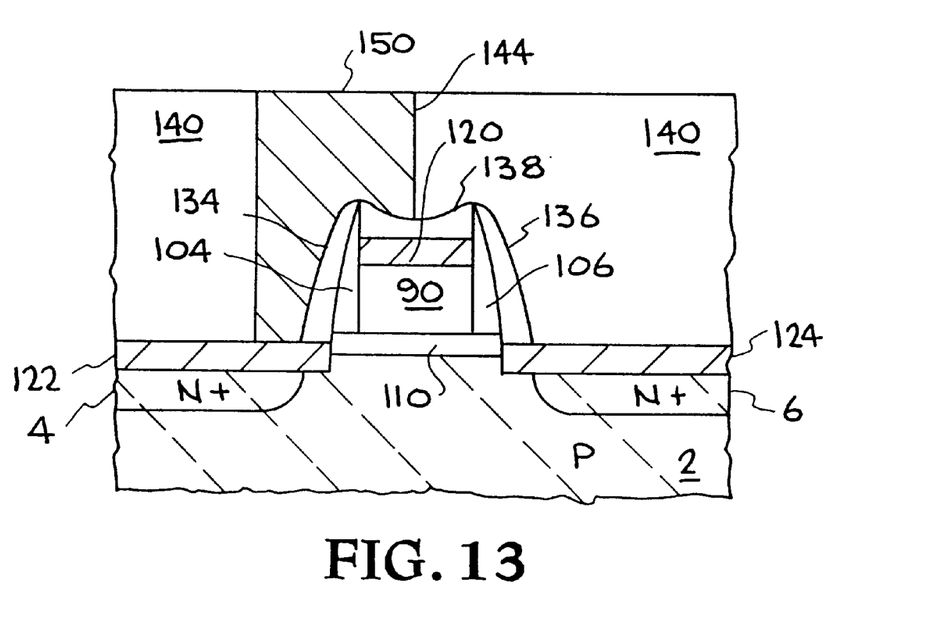
FIG. 13 is a fragmentary vertical cross-sectional view of the structure of FIG. 12 after deposition of a layer of fourth insulation material over the structure, the formation of a misaligned contact opening in the layer of fourth insulation material to a source/drain region, and the filling of the contact opening with metal, showing the protection of the gate electrode from shorting afforded by the third insulation material over the metal silicide on the gate electrode.

After formation of source/drain regions 4 and 6 in substrate 2, a layer 140 of a fourth insulation material may be blanket deposited over the structure. As shown in FIG. 13, layer 140 is preferably a planarized layer, to facilitate the formation of a metal interconnect or wiring harness thereon, and therefore layer 140 may comprise a single layer or may comprise a composite layer which includes one or more upper planarizing layers. Layer 140, which comprises the conventional insulation layer formed between either the substrate and the first metal layer, or between multiple wiring levels, will be formed of conventional thickness, i.e., a thickness ranging from about 4000 Angstroms to as much as about 10,000 Angstroms.

While layer 140 may comprise any of the previously discussed insulation materials, in accordance with the invention, it is very important that layer 140 comprise an insulation material or materials which will etch selectively to the third insulation material comprising layer 130. As illustrated in FIG. 13, when a misaligned contact opening 144 is formed in layer 140 to metal silicide source/drain portion 122 over source/drain region 4, the presence of gate insulation cap 138 (which is formed from the third insulation material of layer 130) prevents the subsequent filling of contact opening 144 with metal 150 from forming a conductive path (a short) between source/drain region 4 and gate electrode 90. If, however, the etch system used to form contact opening 144 in layer 140 was not selective to the third insulation material (i.e., if it also etched gate insulation cap 138), the result would be a loss of the protection afforded gate electrode 90 by gate insulation cap 138.

Thus, if the fourth insulation material comprising insulation layer 140 comprises a silicon oxide which has been doped to facilitate planarization of insulation layer 140, then the third insulation material used to form insulation layer 130 should comprise either an undoped silicon oxide (which will etch at a slower rate than doped silicon oxide in the same etch system), or a silicon nitride material. Conversely, of course, if the fourth insulation material comprising insulation layer 140 comprises silicon nitride, or an undoped silicon oxide, the choice of third insulation materials used for insulation layer 130 will be adjusted accordingly to achieve the same result, i.e., the selective etching of insulation layer 140 without the concurrent etching of gate insulation cap 138.

Thus, the invention provides a process for the formation of self-aligned contact openings for an MOS device of an integrated circuit structure wherein the metal silicide gate portion and the metal silicide source/drain portions may all be formed at the same time, thus conserving the amount of heat the structure is exposed to, while still preventing the inadvertent shorting of the MOS device by a misaligned contact opening. Furthermore, it will be noted that the single step of metal silicide formation occurs at a later time in the process of the invention than in the prior art, thus permitting the possible use of lower temperature silicide-forming metals in the process.

Having thus described the invention what is claimed is:

1. A process for forming self-aligned contacts to an MOS device on an integrated circuit structure which comprises:
    a) forming a gate oxide layer on a silicon substrate;
    b) forming a polysilicon gate electrode layer over said gate oxide layer;
    c) forming a layer of first insulation material over said polysilicon gate electrode layer;
    d) patterning said layer of first insulation layer and said polysilicon gate electrode layer to form a polysilicon gate electrode having its upper surface covered with said first insulation material;
    e) forming thin sidewall spacers of a second insulation material different from said first insulation material on the sidewalls of said polysilicon gate electrode and said first insulation material thereon by anisotropic etching of said second insulation material and of exposed portions of said gate oxide layer to expose portions of said silicon substrate;
    f) selectively removing said first insulation material over said polysilicon gate electrode to expose the upper surface of said polysilicon gate electrode;
    g) forming metal silicide simultaneously on said exposed surface of said polysilicon gate electrode and over said exposed portions of said silicon substrate to form metal silicide over said gate electrode and metal silicide portions on said silicon substrate;
    h) forming source/drain regions in said silicon substrate beneath said metal silicide portions formed over said exposed portions of said silicon substrate;
    i) forming a layer of third insulation material over said structure;
    j) anisotropically etching said layer of third insulation material to form thick sidewall spacers of said third insulation material on said thin sidewall spacers and third insulation material over said metal silicide formed on said gate electrode; and
    k) forming over said structure a layer of fourth insulation material different from said third insulation material;
    whereby said third insulation material over said metal silicide gate electrode portion will protect said metal silicide gate electrode portion from any misalignment during formation of a source/drain contact opening through said fourth insulation.

2. The process of claim 1 wherein said layer of first insulation material is selected from the group consisting of undoped silicon oxide, silicon nitride, phosphorus-doped silicon oxide (PSG), boron-doped silicon oxide (BSG), and boron and phosphorus doped silicon oxide (BPSG).

3. The process of claim 1 wherein said layer of first insulation material comprises silicon nitride.

4. The process of claim 1 wherein the thickness of said layer of first insulation material ranges from about 500 Angstroms to about 2000 Angstroms.

5. The process of claim 1 wherein said step of forming said thin sidewall spacers of a second insulation material different from said first insulation material on the sidewalls of said polysilicon gate electrode and said first insulation material thereon further comprises depositing on said structure a layer of second insulation material selected from the group consisting of undoped silicon oxide and silicon nitride.

6. The process of claim 5 wherein said layer of second insulation material comprises the same material as said gate oxide layer.

7. The process of claim 5 wherein the thickness of said layer of second insulation material ranges from about 100 Angstroms to about 1000 Angstroms.

8. The process of claim 1 wherein said step of forming said metal silicide over said polysilicon gate electrode and over exposed portions of said silicon substrate further includes the steps of:
    a) depositing a silicide-forming metal over said structure;
    b) annealing said structure at a temperature sufficient to cause said silicide-forming metal to react with said polysilicon gate electrode and said exposed portions of said silicon substrate to form said metal silicide; and c) selectively removing unreacted metal from said structure.

9. The process of claim 1 wherein said step of forming said source/drain regions in said substrate further comprise implanting said substrate through said metal silicide portions formed thereon, whereby said metal silicide portions on said silicon substrate are in electrical communication with said source/drain regions thereunder.

10. The process of claim 1 wherein said step of forming said source/drain regions in said substrate occurs before formation of said metal silicide portions on said silicon substrate whereby said metal silicide portions subsequently formed on said silicon substrate are formed over said source/drain regions and in electrical communication with said source/drain regions thereunder.

11. The process of claim 1 wherein said layer of third insulation material is selected from the group consisting of undoped silicon oxide and silicon nitride.

12. The process of claim 1 wherein the thickness of said layer of third insulation material over said source/drain regions is greater than ½ of the width of said polysilicon gate electrode.

13. The process of claim 1 wherein the thickness of said layer of third insulation material over said source/drain regions ranges from about 350 Angstroms to about 4000 Angstroms.

14. The process of claim 1 wherein said layer of third insulation material comprises silicon nitride.

15. The process of claim 1 wherein said layer of fourth insulation material is selected from the group consisting of undoped silicon oxide, silicon nitride, phosphorus-doped silicon oxide (PSG), boron-doped silicon oxide (BSG), and boron and phosphorus doped silicon oxide (BPSG).

16. The process of claim 1 wherein said layer of third insulation material comprises silicon nitride and said layer of fourth insulation material comprises silicon oxide selected from the group consisting of undoped silicon oxide, phosphorus-doped silicon oxide (PSG), boron-doped silicon oxide (BSG), and boron and phosphorus doped silicon oxide.

17. A process for forming self-aligned contacts to an MOS device on an integrated circuit structure which comprises:

a) forming a gate oxide layer on a silicon substrate;

b) forming a polysilicon gate electrode layer over said gate oxide layer;

c) forming a layer of first insulation material over said polysilicon gate electrode layer selected from the group consisting of undoped silicon oxide, silicon nitride, phosphorus-doped silicon oxide (PSG), boron-doped silicon oxide (BSG), and boron and phosphorus doped silicon oxide (BPSG);

d) patterning said layer of first insulation layer and said polysilicon gate electrode layer to form a polysilicon gate electrode having its upper surface covered with said first insulation material;

e) depositing on said structure a layer of second insulation material different from said first insulation material, said second insulation material selected from the group consisting of undoped silicon oxide and silicon nitride, and having a thickness ranging from about 100 Angstroms to about 1000 Angstroms;

f) forming thin sidewall spacers of said second insulation material on the sidewalls of said polysilicon gate electrode and said first insulation material thereon by selective anisotropic etching of said second insulation material and of exposed portions of said gate oxide layer to expose portions of said silicon substrate;

g) selectively removing said first insulation material over said polysilicon gate electrode to expose the upper surface of said polysilicon gate electrode;

h) forming metal silicide simultaneously on said exposed surface of said polysilicon gate electrode and over said exposed portions of said silicon substrate by the steps of:

i) depositing a silicide-forming metal over said structure;

ii) annealing said structure at a temperature sufficient to cause said silicide-forming metal to react with said polysilicon gate electrode and said exposed portions of said silicon substrate to form said metal silicide; and iii) selectively removing unreacted metal from said structure;

to thereby form a metal silicide gate portion and metal silicide portions on said silicon substrate;

i) forming source/drain regions in said silicon substrate beneath said metal silicide portions formed over said exposed portions of said silicon substrate by implanting said substrate through said metal silicide portions formed thereon, whereby said metal silicide portions on said silicon substrate become metal silicide source/drain portions;

j) forming a layer of third insulation material over said structure selected from the group consisting of undoped silicon oxide and silicon nitride, said layer of third insulating material having a thickness, above said source/drain regions, ranging from about 350 Angstroms to about 4000 Angstroms, and greater than ½ the width of said polysilicon gate electrode;

k) anisotropically etching said layer of third insulation material to form thick sidewall spacers of said third insulation material on said thin sidewall spacers and third insulation material over said metal silicide formed on said gate electrode; and l) forming over said structure a layer of fourth insulation material different from said third insulation material and selected from the group consisting of undoped silicon oxide, silicon nitride, phosphorus-doped silicon oxide (PSG), boron-doped silicon oxide (BSG), and boron and phosphorus doped silicon oxide (BPSG);

whereby said third insulation material over said metal silicide gate electrode portion will protect said metal silicide gate electrode portion from any misalignment during formation of a source/drain contact opening through said layer of fourth insulation material.

18. The process of claim 17 wherein said layer of fourth insulation material comprises silicon oxide selected from the group consisting of undoped silicon oxide, phosphorus-doped silicon oxide (PSG), boron-doped silicon oxide (BSG), and boron and phosphorus doped silicon oxide.

19. The process of claim 17 including the further step of forming a source/drain contact opening in said layer of fourth insulation material.

20. A process for forming self-aligned contacts to an MOS device on an integrated circuit structure which comprises:

a) forming a gate oxide layer on a silicon substrate;

b) forming a polysilicon gate electrode layer over said gate oxide layer;

c) forming a layer of first insulation material over said polysilicon gate electrode layer selected from the group consisting of undoped silicon oxide, silicon nitride, phosphorus-doped silicon oxide (PSG), boron-doped silicon oxide (BSG), and boron and phosphorus doped silicon oxide (BPSG);

d) patterning said layer of first insulation layer and said polysilicon gate electrode layer to form a polysilicon gate electrode having its upper surface covered with said first insulation material;

e) forming source/drain regions in said silicon substrate adjacent said silicon substrate beneath said gate electrode;

f) depositing on said structure a layer of second insulation material different from said first insulation material, said second insulation material selected from the group consisting of undoped silicon oxide and silicon nitride, and having a thickness ranging from about 100 Angstroms to about 1000 Angstroms;

g) forming thin sidewall spacers of said second insulation material on the sidewalls of said polysilicon gate electrode and said first insulation material thereon by selective anisotropic etching of said second insulation material and of exposed portions of said gate oxide layer to expose portions of said silicon substrate;

h) selectively removing said first insulation material over said polysilicon gate electrode to expose the upper surface of said polysilicon gate electrode;

i) forming metal silicide simultaneously on said exposed surface of said polysilicon gate electrode and over said source/drain region in said silicon substrate by the steps of:
  i) depositing a silicide-forming metal over said structure;
  ii) annealing said structure at a temperature sufficient to cause said silicide-forming metal to react with said polysilicon gate electrode and said exposed portions of said silicon substrate to form said metal silicide; and
  iii) selectively removing unreacted metal from said structure; to thereby form metal silicide over said gate electrode and metal silicide over said source/drain regions in said silicon substrate;

j) forming a layer of third insulation material over said structure selected from the group consisting of undoped silicon oxide and silicon nitride, said layer of third insulating material having a thickness, above said source/drain regions, ranging from about 350 Angstroms to about 4000 Angstroms, and greater than ½ the width of said polysilicon gate electrode;

k) anisotropically etching said layer of third insulation material to form thick sidewall spacers of said third insulation material on said thin sidewall spacers and third insulation material over said metal silicide formed on said gate electrode; and l) forming over said structure a layer of fourth insulation material different from said third insulation material and selected from the group consisting of undoped silicon oxide, silicon nitride, phosphorus-doped silicon oxide (PSG), boron-doped silicon oxide (BSG), and boron and phosphorus doped silicon oxide (BPSG);

whereby said third insulation material over said metal silicide gate electrode portion will protect said metal silicide gate electrode portion from any misalignment during formation of a source/drain contact opening through said layer of fourth insulation material.

21. The process of claim 20 wherein said layer of fourth insulation material comprises silicon oxide selected from the group consisting of undoped silicon oxide, phosphorus-doped silicon oxide (PSG), boron-doped silicon oxide (BSG), and boron and phosphorus doped silicon oxide.

22. The process of claim 20 including the further step of forming a source/drain contact opening in said layer of fourth insulation material.

23. A process for forming self-aligned contacts to an MOS device on an integrated circuit structure which comprises:

a) forming a gate oxide layer on a silicon substrate;

b) forming a polysilicon gate electrode layer over said gate oxide layer, said polysilicon layer having a thickness ranging from about 1000 Angstroms to about 3500 Angstroms;

c) forming a layer of first insulation material over said polysilicon gate electrode layer selected from the group consisting of undoped silicon oxide, silicon nitride, phosphorus-doped silicon oxide (PSG), boron-doped silicon oxide (BSG), and boron and phosphorus doped silicon oxide (BPSG), said layer of first insulating material having a thickness ranging from about 500 Angstroms to about 2000 Angstroms;

d) patterning said layer of first insulation layer and said polysilicon gate electrode layer to form a polysilicon gate electrode having its upper surface covered with said first insulation material;

e) depositing on said structure a layer of second insulation material different from said first insulation material, said second insulation material selected from the group consisting of undoped silicon oxide and silicon nitride, and having a thickness ranging from about 100 Angstroms to about 1000 Angstroms;

f) forming thin sidewall spacers of said second insulation material on the sidewalls of said polysilicon gate electrode and said first insulation material thereon by selective anisotropic etching of said second insulation material and of exposed portions of said gate oxide layer to expose portions of said silicon substrate;

g) selectively removing said first insulation material over said polysilicon gate electrode to expose the upper surface of said polysilicon gate electrode;

h) forming metal silicide simultaneously on said exposed surface of said polysilicon gate electrode and over said exposed portions of said silicon substrate by the steps of:
  i) depositing a silicide-forming metal over said structure;
  ii) annealing said structure at a temperature sufficient to cause said silicide-forming metal to react with said polysilicon gate electrode and said exposed portions of said silicon substrate to form said metal silicide; and
  iii) selectively removing unreacted metal from said structure; to thereby form a metal silicide gate portion and metal silicide portions on said silicon substrate;

i) forming source/drain regions in said silicon substrate beneath said metal silicide portions formed over said exposed portions of said silicon substrate by implanting said substrate through said metal silicide portions formed thereon, whereby said metal silicide portions on said silicon substrate become metal silicide source/drain portions;

j) forming a layer of third insulation material over said structure selected from the group consisting of undoped silicon oxide and silicon nitride, said layer of third insulating material having a thickness ranging from about 350 Angstroms to about 4000 Angstroms;

k) anisotropically etching said layer of third insulation material to form thick sidewall spacers of said third insulation material on said thin sidewall spacers and third insulation material over said metal silicide formed on said gate electrode;

l) forming over said structure a layer of fourth insulation material different from said third insulation material selected from the group consisting of undoped silicon oxide, silicon nitride, phosphorus-doped silicon oxide (PSG), boron-doped silicon oxide (BSG), and boron and phosphorus doped silicon oxide (BPSG); and m) forming a source/drain contact opening in said layer of fourth insulation material;

whereby said third insulation material over said metal silicide gate electrode portion will protect said metal silicide gate electrode portion from any misalignment during formation of said source/drain contact opening through said layer of fourth insulation material.

\* \* \* \* \*